US006162672A

United States Patent [19]

Lee

[11] Patent Number: 6,162,672

[45] Date of Patent: Dec. 19, 2000

[54] METHOD FOR FORMING INTEGRATED CIRCUIT MEMORY DEVICES WITH HIGH AND LOW DOPANT CONCENTRATION REGIONS OF DIFFERENT DIFFUSIVITIES

[75] Inventor: Kyu-pil Lee, Kyungki-do, Rep. of Korea

[73] Assignee: SamSung Electronics Co., Ltd., Rep. of Korea

[21] Appl. No.: 09/233,412

[22] Filed: Jan. 19, 1999

Related U.S. Application Data

[62] Division of application No. 08/854,874, May 12, 1997, Pat. No. 5,969,395.

[30] Foreign Application Priority Data

May 15, 1996 [KR] Rep. of Korea .......................... 96-16252

[51] Int. Cl.$^{7}$ .......................... H01L 21/8242

[52] U.S. Cl. .......................... 438/238; 438/252

[58] Field of Search .......................... 438/238–267, 438/381–399, 199–202, 275, 303

[56] References Cited

U.S. PATENT DOCUMENTS

| | | | |
|---|---|---|---|
| 4,878,100 | 10/1989 | McDavid | 357/23.3 |
| 5,021,851 | 6/1991 | Haken et al. | 357/23.9 |
| 5,296,399 | 3/1994 | Park . | |
| 5,324,680 | 6/1994 | Lee et al. | 437/52 |

*Primary Examiner*—Jey Tsai
*Attorney, Agent, or Firm*—Myers Bigel Sibley & Sajovec

[57] ABSTRACT

An integrated circuit memory device includes a substrate divided into a cell array region, a core region, and a peripheral circuit region. A plurality of memory cells in the memory cell region each comprise a memory cell transistor having first spaced apart source/drain regions of the substrate with a predetermined conductivity. A sensing circuit in the core region of the substrate includes a sensing transistor having second spaced apart source/drain regions of the substrate. Each of the second source/drain regions includes high and low concentration regions of the predetermined conductivity wherein the high and low concentration regions are doped with a common dopant. A peripheral circuit in the peripheral region of the substrate includes a peripheral transistor having third spaced apart source/drain regions wherein each of the third source/drain regions has high and low concentration regions thereof. The high concentration region of the third source/drain regions has a first dopant and the low concentration region of the third source/drain region has a second dopant. Related methods are also discussed.

12 Claims, 4 Drawing Sheets

104 105 110a 110a 105 104 110a 105 104 103 112 106 102 112 108 103 108 112 102 112 106 103 106 100
CELL ARRAY REGION CORE REGION PERIPHERAL REGION

METHOD FOR FORMING INTEGRATED CIRCUIT MEMORY DEVICES WITH HIGH AND LOW DOPANT CONCENTRATION REGIONS OF DIFFERENT DIFFUSIVITIES

This is a division of application Ser. No. 08/854,874, file May 12, 1997, now U.S. Pat. No. 5,969,395.

FIELD OF THE INVENTION

The present invention relates to integrated circuit methods and structures and more particularly to memory devices and related methods.

BACKGROUND OF THE INVENTION

In a dynamic random access memory (DRAM) device, information is stored as a charge on a memory cell capacitor, and this charge may be lost through various paths over time. Accordingly, refresh operations may be needed to recharge the memory cell capacitors to ensure the integrity of the stored data. The interval of time between refresh operations is referred to as the refresh time, and the refresh time can be increased by increasing the capacitance of the memory cell capacitor thus increasing the charge stored by the memory cell capacitor. Alternately, the refresh time can be increased by improving device characteristics so that the leakage of charge from the memory cell capacitor is reduced.

FIG. 1 is a cross-sectional view of a conventional memory device. As shown, device isolation layers 12 on the semiconductor substrate 10 define the cell array region, the core region, and the peripheral circuit region. In the cell array region, a plurality of memory cells are arranged in a matrix, and these memory cells are used to store data. Sense amplifiers and decoders are arranged in the core region to sense the stored data. In the peripheral circuit region, circuits are provided for driving the memory cells of the memory cell array region.

In the cell array region, the transistors include gate electrodes 14 and source/drain regions 16 wherein the source/drain regions 16 comprise doped regions of the substrate having a relatively low dopant concentration. In addition, an insulating layer 18 is formed on the gate electrodes 14 of the cell array region. In the core region and in the peripheral circuit region, transistors include gate electrodes 14 and source/drain regions having either a lightly doped drain (LDD) or double diffused drain (DDD) structure. In particular, source/drain regions of the core and peripheral circuit regions include relatively low dopant concentration regions 16 and relatively high dopant concentration regions 20. In addition, spacers **18*a* are formed on the sidewalls of the gate electrodes 14** in the core and peripheral circuit regions.

The source/drain regions of the transistors formed in the cell array region have the low dopant concentration regions 16 but do not have high dopant concentration regions. In particular, the low dopant concentration regions 16 of the cell array region can be formed by implanting an N-type dopant such as phosphorous at a dose on the order of $10^{13}$ $cm^{-2}$.

Transistors in the core and peripheral circuit regions comprise source/drain regions having the low dopant concentration regions 16 and the high dopant concentration regions 20. The low dopant concentration regions 16 can be formed by implanting an N-type dopant such as phosphorous at a dose of about $10^{13}$ $cm^{-2}$. The high dopant concentration regions 20 can be formed by implanting the N-type impurity at a dose on the order of $10^{15}$ $cm^{-2}$ after forming the spacers on the sidewalls of the gate electrodes.

As the design rules for memory devices approach 0.2 $\mu$m or less, however, the length of the gate electrodes of transistors formed in the core region are reduced as the design rules are reduced. In contrast, the gate electrodes of transistors formed in the peripheral circuit region may be maintained above a certain length to provide a desired current driving ability. Accordingly, length of gate electrodes in the peripheral circuit region may not be reduced in direct proportion to any reductions in the design rules. In a conventional memory device as shown in FIG. 1, a transistor formed in a core region may have a shorter effective channel than a transistor formed in the peripheral circuit region because the gate electrodes formed in the core region may be shorter than those formed in the peripheral circuit region. As shown in FIG. 1, however, the source/drain regions of the core region may be the same as those formed in the peripheral circuit region. Accordingly, reductions in the design rule may result in smaller effective channel lengths in the core region in comparison with those of the peripheral circuit region thereby reducing a punch-through margin of the transistors formed in the core region.

Accordingly, there continues to exist a need in the art for improved methods for forming integrated circuit memory devices and related structures. In particular, methods and structures are needed to provide transistors having reduced leakage current in the cell array region. In addition, transistors in the core region should provide a relatively short gate while maintaining a desired effective channel length to reduce punch-through while providing a desired current driving ability. Furthermore, transistors of the peripheral circuit region should provide an increased current driving ability.

SUMMARY OF THE INVENTION

It is therefore an object of the present invention to provide improved memory devices and methods.

It is another object of the present invention to provide memory devices having reduced leakage current, increased punch-through margin, and increased current driving capabilities.

These and other objects can be provided according to the present invention by an integrated circuit memory device including a substrate divided into a cell array region, a core region, and a peripheral circuit region wherein each of these regions is separated by an isolation region. A plurality of memory cells are provided in the cell array region wherein each of the memory cells includes a memory cell access transistor. This memory cell access transistor includes first spaced apart source/drain regions of the substrate having a predetermined conductivity. A sensing circuit is provided in the core region of the substrate wherein the sensing circuit comprises a sensing transistor including second spaced apart source/drain regions of the substrate. Each of the second source/drain regions includes high and low concentration regions of the predetermined conductivity wherein the high and low concentration regions comprise a common dopant. A peripheral circuit is provided in the peripheral region of the substrate wherein a peripheral circuit comprises a peripheral transistor including third spaced apart source/drain regions of the substrate. Each of the third source/drain regions includes high and low conductivity regions of the predetermined conductivity wherein the high concentration region of the third source/drain regions comprises a first dopant, and a low concentration region of the third source/drain regions comprises a second dopant.

Accordingly, the leakage current of the memory cell access transistor can be reduced thus increasing the refresh cycle interval. In addition, the use of high and low doped source/drain regions for the sensing transistor and the peripheral transistor allows desired current handling capacities. In addition, the use of a common dopant for the high and low concentration regions of the sensing transistor provides adequate punch-through margins.

In particular, the common dopant and the first dopant can be the same, and the common dopant can have a diffusivity that is lower than the diffusivity of the second dopant. More particularly, the common dopant and the first dopant can be arsenic, and the second dopant can be phosphorous.

The first spaced apart source/drain regions and the low concentration region of the third source/drain regions can be doped with phosphorous at a concentration on the order of $10^{17}$ to $10^{19}$ $cm^{-3}$. The low concentration regions of the second source/drain regions can be doped with arsenic at a concentration on the order of $10^{17}$ to $10^{19}$ $cm^{-3}$. The high concentration regions of the second source/drain regions and the high concentration regions of the third source/drain regions can be doped with arsenic at a concentration on the order of $10^{18}$ to $10^{21}$ $cm^{-3}$.

According to an alternate aspect of the present invention, a method can be provided for forming an integrated circuit memory device on an integrated circuit substrate. This method includes the steps of forming device isolation regions on a semiconductor substrate wherein the device isolation regions define a cell array region of the substrate, a core region of the substrate, and a peripheral circuit region of the substrate. At least one gate electrode is formed on each of the cell array region, the core region, and the peripheral circuit region, and a first masking layer is formed on the core region of the substrate wherein the masking layer exposes the cell array region and the peripheral circuit region. Exposed portions of the cell array and peripheral circuit regions are doped with a first dopant, and the first masking layer is removed. A second masking layer is formed on the memory cell and peripheral circuit regions wherein the second masking layer exposes the core region of the substrate. Exposed portions of the core region are doped with the second dopant and the second masking layer is removed. Sidewalls are formed adjacent the gate electrodes, and a third masking layer is formed on the memory cell region wherein the third masking layer exposes the core and peripheral circuit regions of the substrate. Exposed portions of the core and peripheral circuit regions are doped with the second dopant.

According to the structures and methods of the present invention, an integrated circuit memory device can be provided having reduced leakage currents, increased punch-through margin, and increased current handling capabilities.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The elements of the drawings are not necessarily to scale, emphasis instead being placed upon clearly illustrating the principles of the present invention. Furthermore, like numbers refer to like elements throughout. It will also be understood that when a layer is referred to as being on another layer or substrate, that layer can be directly on the other layer or substrate, or intervening layers may also be present. In addition, the term “switching device” is broadly defined to include a transistor.

Figure 1:
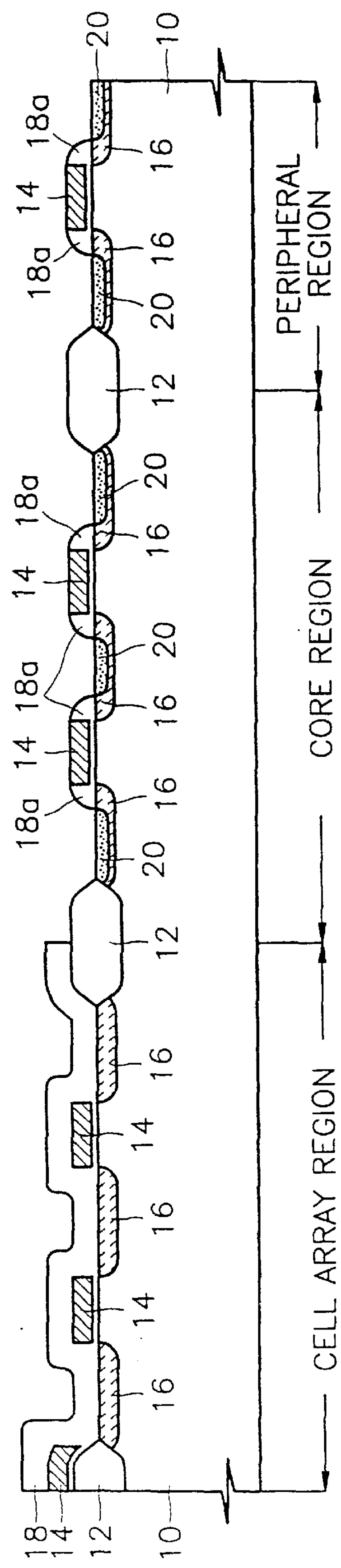
FIG. 1 is a cross-sectional view illustrating an integrated circuit memory device according to the prior art.
Figure 2:
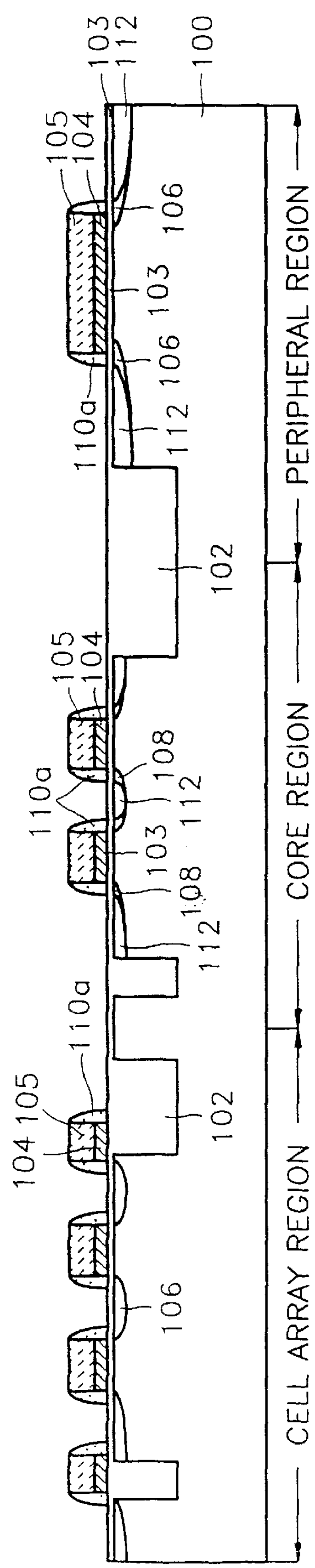
FIG. 2 is a cross-sectional view of an integrated circuit memory device of the present invention.
Figure 5:
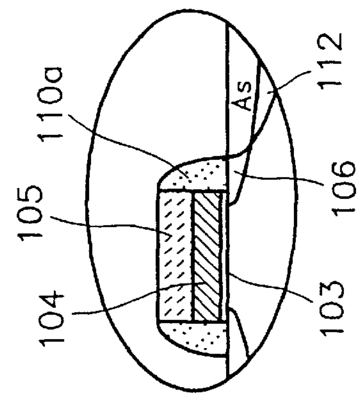
FIG. 5 is an enlarged cross-sectional view of a transistor in the peripheral circuit region of FIG. 2.
Figure 4:
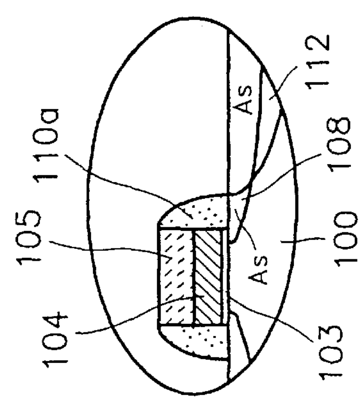
FIG. 4 is an enlarged cross-sectional view of a transistor in the core region of FIG. 2.
Figure 3:
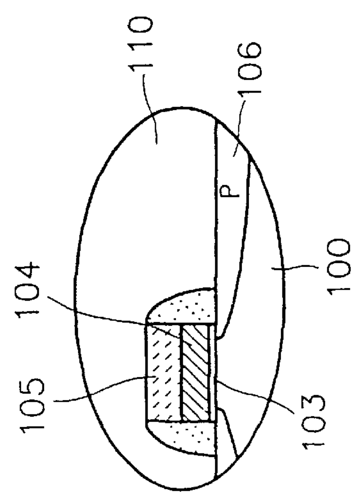
FIG. 3 is an enlarged cross-sectional view of a transistor in the cell array region of FIG. 2.

FIG. 2 is a cross-sectional view illustrating an integrated circuit memory device according to the present invention. FIG. 3 is a magnified cross-sectional view illustrating a transistor in the cell array region of the memory structure of FIG. 2. FIG. 4 is an enlarged cross-sectional view of a transistor in the core region of the memory device of FIG. 2. FIG. 5 is an enlarged cross-sectional view of a transistor in the peripheral circuit region of the memory device of FIG. 2.

Referring to FIG. 2, trench-type device isolation oxide layers 102 are formed on the substrate 100, and these isolation oxide layers separate the cell array region, the core region, and the peripheral circuit region. Doped source/drain regions 106, 108, and 112 of the substrate are formed in the active regions of the substrate. In particular, these doped source/drain regions 106, 108 and 112 may have a first conductivity and the substrate 100 may have a second conductivity different from the first conductivity. The gate insulating layers 103, the gate electrodes 104, and the capping layers 105 are also formed in the active regions. Spacers 110*a* are formed on the sides of the gate electrodes 104 as shown.

Referring to FIG. 3, transistors in the cell array region have source/drain regions with a relatively low dopant concentration region 106. In particular, these low dopant concentration regions can be doped with an N-type dopant such as phosphorous. Accordingly, the formation of these low dopant concentration regions 106 may result in only negligible lattice defects in the substrate 100. Leakage current in the memory cell access transistors is thus reduced thereby increasing minimum refresh intervals for the memory device. The N-type doped region is preferably formed by implanting phosphorous ions to a concentration on the order of $10^{17}$ to $10^{19}$ $cm^{-3}$.

Referring to FIG. 4, transistors in the core region of the substrate comprise source/drain regions having a low dopant concentration region 108 that extends laterally beyond a relatively high dopant concentration impurity region 112 toward the transistor channel. Alternately, the source/drain regions in the core region can have a double diffused drain structure wherein the low dopant concentration $N^-$ region 108 surrounds the high dopant concentration $N^+$ region 112. Here, the low dopant concentration $N^-$ region 108 can be doped with arsenic (As) ions at a concentration on the order of $10^{17}$ to $10^{19}$ $cm^{-3}$, while the relatively high dopant concentration $N^+$ region 112 can be formed from arsenic ions at a concentration on the order of $10^{18}$ to $10^{21}$ $cm^{-3}$.

Referring to FIG. 5, transistors in the peripheral circuit region may have a lightly doped drain (LDD) structure similar to that of the transistors formed in the core region. Transistors formed in the peripheral circuit region, however, may have longer gate electrodes than those of the core region. In addition, the low dopant concentration $N^-$ regions 106 may be formed from phosphorous ions at a concentration on the order of $10^{17}$ to $10^{19}$ $cm^{-3}$. The high dopant concentration $N^+$ regions 112 may be formed from arsenic ions at a concentration on the order of $10^{18}$ to $10^{21}$ $cm^{-3}$.

Accordingly, the dopant of the $N^-$ doped region 108 of the core region will exhibit a lower diffusivity than that of the $N^-$ doped region 106 of the peripheral circuit region. In other words, during processing, the phosphorous ions which make up the $N^-$ doped region 106 in the peripheral circuit region diffuse more readily than the arsenic ions which make up the $N^-$ doped region 108 in the core region because phosphorous has a higher diffusivity than arsenic. The current driving ability of transistors in the core region is thus increased because the source/drain region of the transistors in the core region include an LDD or DDD structure. Furthermore, the effective channel length of transistors in the core region can be increased because lateral diffusion of dopants from the $N^-$ doped region 108 can be reduced. Accordingly, even though the gate electrode in the core region is shorter than that in the peripheral circuit region, punch-through can be reduced.

Figure 6:
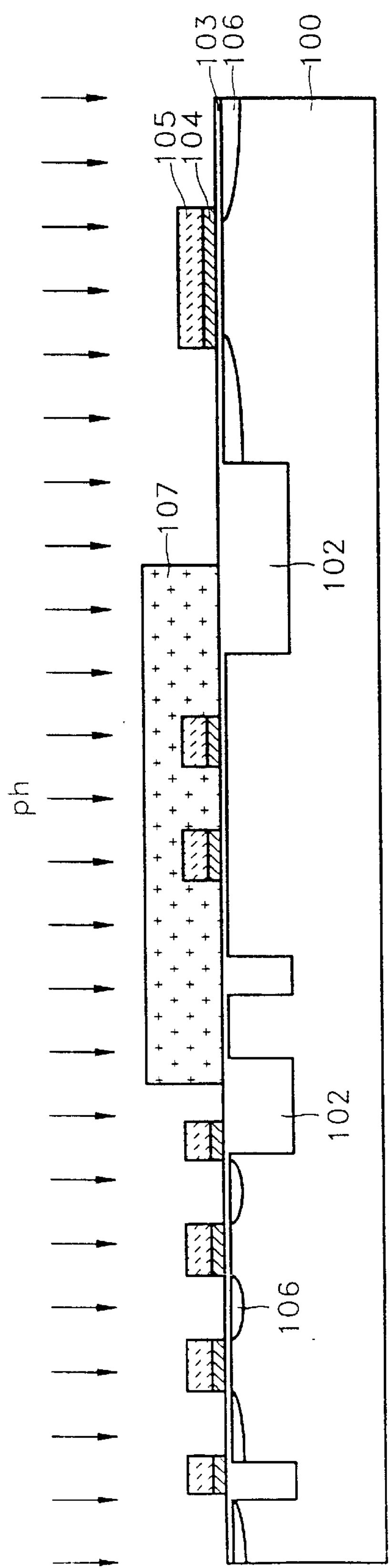
FIGS. 6 through 8 are cross-sectional views illustrating steps of a method for forming an integrated circuit memory device according to the present invention.
Figure 7:
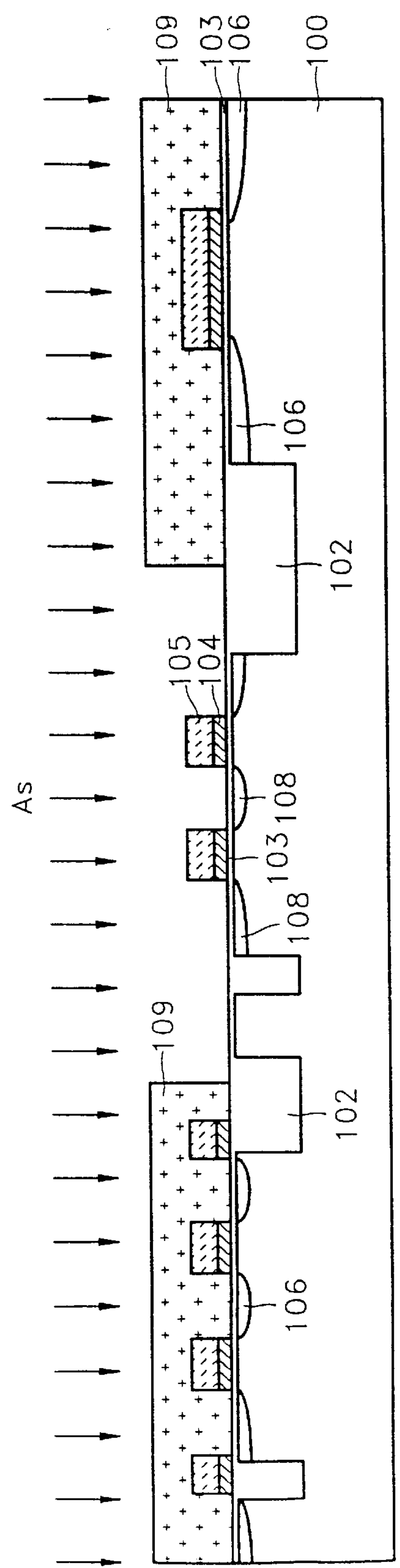
Figure 8:
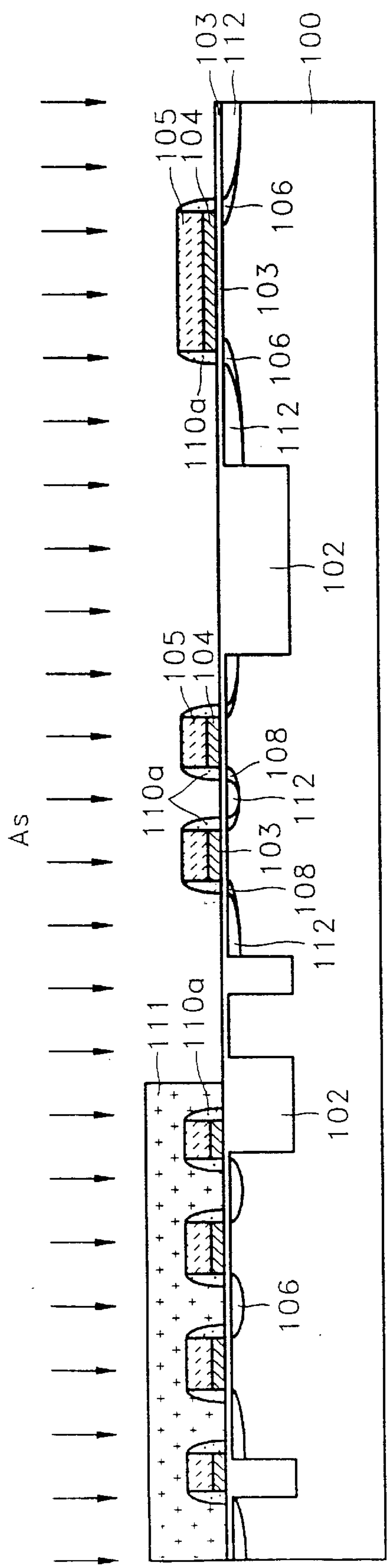

FIGS. 6, 7 and 8 are cross-sectional views illustrating steps of a method for fabricating an integrated circuit memory device according to the present invention. As shown in FIG. 6, active regions are separated from a field region by forming device isolation regions 102 on a semiconductor substrate 100 of a first conductivity type. For example, the device isolation regions 102 can be formed using a shallow trench isolation process, and the substrate 100 can have a P-type conductivity. A gate insulating layer 103 can then be formed on the substrate 100. In addition, a conductive layer and an insulating layer for the gate electrode can be sequentially formed on the gate insulating layer 103. The individual gate electrodes 104 and gate capping layers 105 can then be formed by patterning the insulated layer and conductive layer. In particular, the gate electrodes 104 can be formed from a layer of polysilicon, or from a polycide structure including a high-melting point metal silicide stacked on a polysilicon layer. A photoresist pattern 107 is then formed to cover the core region while exposing the cell array region of a peripheral circuit region. The photoresist pattern can be formed by coating a layer of photoresist on the substrate and then patterning the photoresist layer by using photolithography. The phosphorous doped $N^-$ doped regions 106 can be formed having a dopant concentration on the order of $10^{17}$ to $10^{19}$ $cm^{-3}$ in the cell array region and the peripheral circuit region by implanting phosphorous ions using the photoresist pattern 107 as a mask.

The first photoresist pattern 107 is removed, and a second photoresist pattern 109 is formed covering the cell array and peripheral circuit regions and exposing the core region as shown in FIG. 7. In particular, the second photoresist pattern 109 is formed using photolithography. Arsenic ions can then be implanted using the second photoresist pattern 109 as a mask to form the $N^-$ doped regions 108 in the core region. More particularly, arsenic ions can be implanted to create $N^-$ doped regions 108 having a dopant concentration on the order of $10^{17}$ to $10^{19}$ $cm^{-3}$.

After removing the second photoresist pattern 109, spacers **110*a* are formed as shown in FIG. 8. In particular, the spacers are formed by depositing an insulating layer 110 such as a layer of silicon nitride or silicon oxide on the surface of the substrate. The insulating layer 110 is then anisotropically etched to form the spacers 110*a* on the sidewalls of the gate electrodes 104. A third photoresist pattern 111 is then formed covering the cell array region and exposing the core region in the peripheral circuit region. As before, this photoresist pattern is formed using photolithography. Arsenic ions are then implanted into the exposed portions of the substrate using the third photoresist pattern 111 as a mask. Accordingly, the $N^+$ doped regions 112** can have a dopant concentration on the order of $10^{18}$ to $10^{21}$ $cm^{-3}$.

Using the method discussed above with reference to FIGS. 6, 7, and 8, a transistor in a cell array region includes a phosphorous doped $N^-$ source/drain region. A transistor in the core region includes a source/drain region with $N^-$ and $N^+$ arsenic doped regions. In particular, the $N^-$ doped region of the transistor in the core region extends laterally beyond the $N^+$ doped region toward the transistor channel. A transistor in the peripheral circuit region includes a source/drain region with an $N^-$ phosphorous doped region and an $N^+$ arsenic doped region.

Accordingly, the transistors in the cell array region may have reduced leakage currents resulting in increased refresh intervals because the source/drain regions thereof are formed using $N^-$ phosphorous doping. The transistors formed in the core and peripheral circuit regions may have increased current driving capabilities because they are formed with LDD or DDD structures wherein the source/drain regions thereof have $N^-$ and $N^+$ doped regions. In addition, the $N^-$ arsenic doped regions 108 of the core region may have a lower diffusivity than the $N^-$ phosphorous doped regions in the peripheral circuit region. Accordingly, the effective channel length of the transistors in the core region can be increased because the lateral diffusion of the arsenic ions of the $N^-$ doped region thereof is relatively low. Punch-through can thus be reduced even though the gate is shorter in the core region than that in the peripheral circuit region when design rules are reduced.

Figure 9:
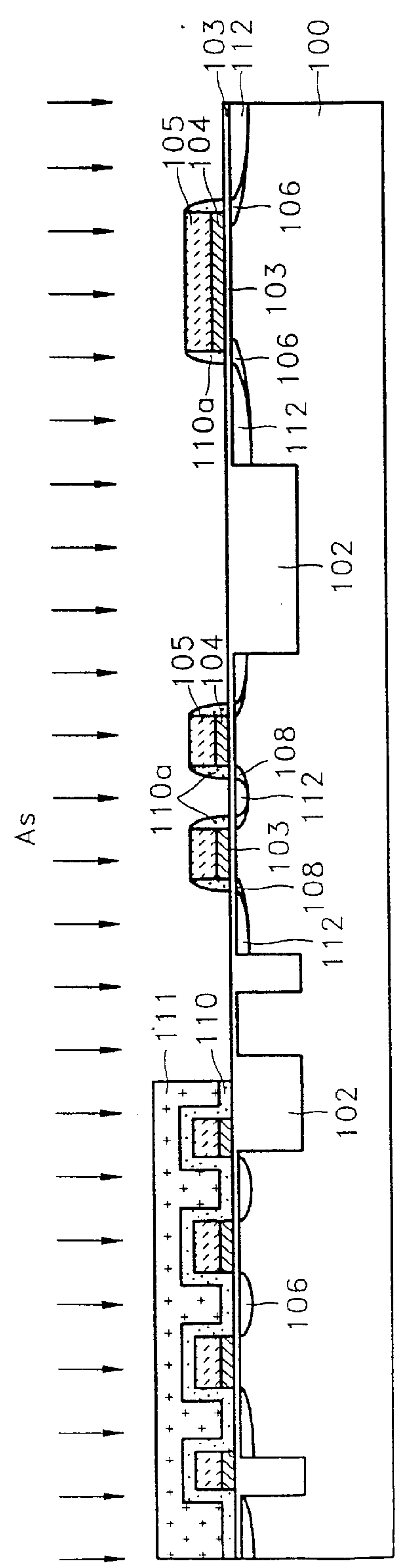
FIG. 9 is a cross-sectional view illustrating an alternate step for forming an integrated circuit memory device according to the present invention.

FIG. 9 is a cross-sectional view illustrating an alternate step in a method for forming an integrated circuit memory device according to the present invention. This method uses the same steps discussed above with reference to FIGS. 6 and 7 to the point of forming the second doped regions 108. In particular, FIG. 9 illustrates an alternate step for forming the spacers. In particular, an insulating layer 110 is formed, and the third photoresist pattern 111 is formed thereon covering portions of the insulating layer opposite the cell array region. The photoresist pattern 111, however, exposes portions of the insulating layer 110 over the core and peripheral circuit regions. The exposed portions of the insulating layer 110 are then anisotropically etched using the third photoresist pattern 111 as a mask. The spacers **110*a* are thus formed on sidewalls of the gate electrodes 104 and the capping insulating layers 105 in the core region and in the peripheral circuit region. The insulating layer 110 is thus maintained intact in the core region. The subsequent steps are performed in the same manner as those discussed above with regard to FIGS. 6, 7 and 8**. Accordingly, damage to the substrate in the cell array region can be reduced thus reducing leakage current.

In an integrated circuit memory device formed according to the present invention, defects in the substrate may be reduced in the cell array regions. In particular, lattice defects in portions of a substrate used to form memory cell access transistors may result in junction leakage current thus requiring a shorter refresh time. These defects may be enhanced during subsequent steps such as thermal oxidation or ion implantation. Accordingly, the source/drain regions in the cell array region of a memory device of the present invention are formed by doping with phosphorous at a relatively low concentration on the order of $10^{17}$ to $10^{19}$ $cm^{-3}$. The generation of lattice defects for the memory cell access transistors is thus reduced also reducing the leakage current generated thereby.

In addition, to maintain a desired punch-through for transistors formed in the core region of the memory device while reducing the length of a gate electrode thereof, the transistors of the core region have an LDD or DDD structure wherein the N doped region is formed from arsenic which has a lower diffusivity than phosphorous. Reductions of the effective channel length due to lateral diffusion can thus be reduced thereby increasing punch-through margins.

Furthermore, the current driving capability of transistors in the peripheral circuit region can be increased. In particular, these transistors have an LDD or DDD structure in which the source/drain region includes $N^-$ and $N^+$ doped regions wherein the $N^-$ doped region is doped with phosphorous and the $N^+$ doped region is doped with arsenic.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming an integrated circuit memory device on an integrated circuit substrate, said method comprising the steps of:

forming isolation regions on a semiconductor substrate wherein said isolation regions define a cell array region of said substrate, a core region of said substrate, and a peripheral circuit region of said substrate;

forming at least one gate electrode on each of said cell array region, said core region, and said peripheral circuit region;

doping exposed portions of said cell array and peripheral circuit regions of said substrate adjacent said gate electrodes with a first dopant;

doping exposed portions of said core region of said substrate adjacent said gate electrode with a second dopant which is different from said first dopant;

forming sidewall spacers adjacent said gate electrodes; and doping exposed portions of said core and peripheral circuit regions of said substrate adjacent said spacers with said second dopant.

2. A method according to claim 1 wherein said first dopant comprises phosphorous and said second dopant comprises arsenic.

3. A method according to claim 1 wherein said step of doping said exposed portions of said cell array and peripheral circuit regions comprises doping said cell array and peripheral circuit regions with phosphorous at a concentration on the order of $10^{17}$ to $10^{19}$ $cm^3$.

4. A method according to claim 1 wherein said step of doping exposed portions of said core region comprises doping said core region with arsenic at a concentration on the order of $10^{18}$ to $10^{19}$ $cm^{-3}$.

5. A method according to claim 1 wherein said step of doping exposed portions of said core and peripheral circuit regions comprises doping said core and peripheral circuit regions with arsenic at a concentration on the order of $10^{18}$ to $10^{21}$ $cm^{-3}$.

6. A method according to claim 1 wherein said step of forming said sidewall spacers comprises:

forming an insulating layer on said cell array region, said core region, and said peripheral circuit region wherein said insulating layer covers each of said gate electrodes;

forming a masking layer on a portion of said insulating layer opposite said cell array region wherein said masking layer exposes portions of said insulating layer opposite said core and peripheral circuit regions; and anisotropically etching said exposed portions of said insulating layer to provide insulating spacers along sidewalls of said gate electrodes on said core and peripheral circuit regions of said substrate.

7. A method according to claim 1 wherein said second dopant has a lower diffusivity that said first dopant.

8. A method for fabricating a semiconductor memory device, said method comprising the steps of:

forming a device isolation region in a semiconductor substrate to isolate a cell array region in which a plurality of cells for storing data are arranged, to isolate a core region in which circuits for sensing the data are arranged, and to isolate a peripheral circuit region in which circuits for driving the plurality of cells are arranged;

forming a gate electrode on each of said cell array region, said core region, and said peripheral circuit region;

forming first doped regions in the cell array region and the peripheral circuit region by masking said core region and implanting a first dopant;

forming a second doped region in the core region by masking said cell array region and said peripheral circuit region and implanting a second dopant;

forming spacers on sidewalls of said gate electrodes by depositing an insulating layer on said gate electrodes and anisotropically etching said insulating layer; and forming third doped regions in the core region and peripheral circuit region wherein said third doped region has a higher dopant concentration than said second doped region by masking said cell array region and implanting a third dopant.

9. A method according to claim 8 wherein said first dopant comprises phosphorous at a concentration on the order of $10^{17}$ to $10^{19}$ $cm^{-3}$.

10. A method according to claim 8 wherein said second dopant region comprises arsenic at a concentration on the order of $10^{17}$ to $10^{19}$ $cm^{-3}$.

11. A method according to claim 8 wherein said third dopant comprises arsenic at a concentration on the order of $10^{18}$ to $10^{21}$ $cm^{-3}$.

12. A method according to claim 8 wherein the step of forming a spacer comprises the steps of:

depositing an insulating layer on said gate electrodes and on said substrate;

masking portions of said insulating layer on said cell array region thus exposing portions of said insulating layer on the core region and peripheral circuit region; and forming a spacer on sidewalls of the gate electrodes in the core region and in the peripheral circuit region by anisotropically etching the exposed portions of said insulating layer.

* * * * *

UNITED STATES PATENT AND TRADEMARK OFFICE
CERTIFICATE OF CORRECTION

PATENT NO. : 6,162,672

DATED : December 19, 2000

INVENTOR(S) : Kyu-pil Lee

It is certified that error appears in the above-identified patent and that said Letters Patent is hereby corrected as shown below:

Column 7, line 15 correct "N" to read -- $N^-$ --.

Column 7, line 61 correct "$cm^{3}$" to read -- $cm^{-3}$ --.

Signed and Sealed this

First Day of May, 2001

Attest:

NICHOLAS P. GODICI

*Attesting Officer* *Acting Director of the United States Patent and Trademark Office*